United States Patent [19]
Miller et al.

[11] Patent Number: 5,898,215
[45] Date of Patent: Apr. 27, 1999

[54] MICROELECTRONIC ASSEMBLY WITH CONNECTION TO A BURIED ELECTRICAL ELEMENT, AND METHOD FOR FORMING SAME

[75] Inventors: Dennis Brian Miller, Barrington; Grace M. O'Malley, Hoffman Estates; Brian R. Kemper, Mount Prospect, all of Ill.

[73] Assignee: Motorola, Inc., Schaumburg, Ill.

[21] Appl. No.: 08/766,653

[22] Filed: Dec. 16, 1996

[51] Int. Cl.⁶ .............................. H01L 23/02; H01L 23/48
[52] U.S. Cl. .......................... 257/679; 257/774; 235/380; 361/737; 343/700 R
[58] Field of Search .................................... 257/679, 774; 235/380; 361/737; 343/700 R

[56] References Cited

U.S. PATENT DOCUMENTS

| | | | |
|---|---|---|---|
| 4,361,756 | 11/1982 | Parmenter | 235/487 |
| 5,063,175 | 11/1991 | Broadbent | 437/192 |
| 5,090,119 | 2/1992 | Tsuda et al. | 29/843 |
| 5,128,746 | 7/1992 | Pennisi et al. | 357/72 |
| 5,136,365 | 8/1992 | Pennisi et al. | 357/72 |
| 5,189,638 | 2/1993 | Kimura | 368/52 |
| 5,241,133 | 8/1993 | Mullen, III et al. | 174/52.4 |
| 5,278,726 | 1/1994 | Bernardoni et al. | 361/783 |
| 5,285,352 | 2/1994 | Pastore et al. | 361/707 |
| 5,446,311 | 8/1995 | Ewen et al. | 257/531 |
| 5,463,404 | 10/1995 | Wall | 343/700 MS |
| 5,621,616 | 4/1997 | Owens et al. | 361/704 |

*Primary Examiner*—Teresa M. Arroyo
*Attorney, Agent, or Firm*—Douglas D. Fekete; John B. MacIntyre

[57] ABSTRACT

A microelectronic assembly (10), such as a smart card, is formed by attaching a component subassembly (34) to a substrate (12). The substrate (12) includes a face (26) and defines a via (28) having a via opening (30) at the face (26). The substrate (12) further defines a component cavity (32) at the face (26) that is spaced apart from the via (28). An electrical element (14), such as a wound antenna, is disposed within the substrate (12) and includes a terminal (24) at the via (28). The component subassembly (34) is formed by mounting an integrated circuit component (16) onto a metallic lead (18). The integrated circuit component (16) is electrically connected to the metallic lead (18) by a wire lead (36). A protuberance (20) is connected to the metallic lead (18), preferably by forming a loop from a wire bond. A polymeric body (56) is formed about the component (16) and wire leads (36). The component subassembly (34) is superposed onto the substrate (12), and the component (16) is received in the component cavity (32). The metallic lead (18) is affixed to the face (26) and overlies the via opening (30). The protuberance (20) extends into the via (28) and contacts a conductive body (22) within the via (28). The conductive body (22) electrically connects the protuberance (20) and the terminal (24).

20 Claims, 1 Drawing Sheet

MICROELECTRONIC ASSEMBLY WITH CONNECTION TO A BURIED ELECTRICAL ELEMENT, AND METHOD FOR FORMING SAME

FIELD OF THE INVENTION

This invention relates generally to a microelectronic assembly, such as a smart card, that includes an integrated circuit component mounted to a substrate and connected to an electrical element embedded therein. More particularly, this invention relates to such an assembly wherein the component is mounted to a metallic lead having a protuberance, such as a wire loop, that extends into a via to make a connection to an embedded electrical element.

BACKGROUND OF THE INVENTION

Smart card assemblies are credit-card sized assemblies that include an integrated circuit component attached to a substrate. The integrated circuit component contains information, such as access privileges, account balances, security information, and so forth. Smart card assemblies typically include a plurality of electrical contacts on the surface of the smart card that permit electrical access to information stored in the integrated circuit component.

Contactless cards have been developed to allow utilization of the card without having to make physical contact with a mechanical reader head, thereby making the contactless cards faster to use and their functionality more transparent to the user. An antenna is typically disposed within the card to receive a signal transmitted from a base unit and to transmit a signal back to the base unit.

It is desired to form a smart card that includes the functionality of both the contact card and the contactless card. Such dual interface smart cards include both contact pads and contactless capabilities.

It has been difficult to achieve acceptable results with dual interface smart cards. The process of connecting the antenna to the integrated circuit device that includes external contacts has been difficult to achieve reliably. One proposed solution has been to include two integrated circuit components within the smart card, one for the contact function and one for the contactless function. However, this approach leads to a more expensive smart card and a more complicated manufacturing process.

Therefore, a need exists for a microelectronic assembly that is able to be manufactured in an inexpensive, reliable way that incorporates the functions of both contact and contactless cards.

DETAILED DESCRIPTION OF THE PREFERRED EMBODIMENT

The present invention provides a microelectronic assembly formed by attaching a component subassembly to a substrate. The substrate is preferably formed by laminating polymeric layers about an electrical element, such as an antenna. The substrate defines a via that has an opening at the face of the substrate and a component cavity spaced apart from the via. The electrical element disposed within the substrate includes a terminal at the via. The terminal provides electrical interconnection to the electrical element.

The component subassembly is formed by attaching an integrated circuit component to a lead frame that includes metallic leads. The integrated circuit component is bonded to the lead frame, and an electrical interconnection is formed between the integrated circuit component and the metallic leads, preferably by wire bonding. A polymeric body is formed over the integrated circuit component and the wire bonds. Protuberances, preferably formed by wire bonding a loop to the metallic leads, are formed to protrude from the metallic leads.

The component subassembly is then superposed onto the substrate to form a microelectronic assembly. The metallic lead is affixed to the substrate face and overlies the via opening. The protuberance extends into the via into contact with a conductive body within the via. The conductive body electrically connects the protuberance and the terminal, thereby electrically connecting the integrated circuit component and the terminal to form an integral microelectronic assembly.

Figure 1:
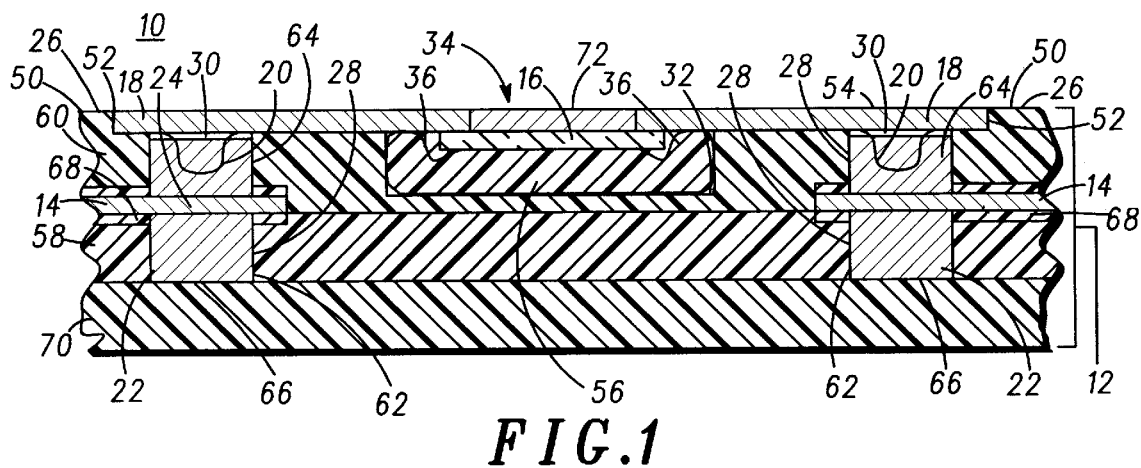
FIG. 1 is a cross-sectional view of a microelectronic assembly including an integrated circuit component and a metallic lead over a substrate in accordance with a preferred embodiment of the invention.
Figure 2:
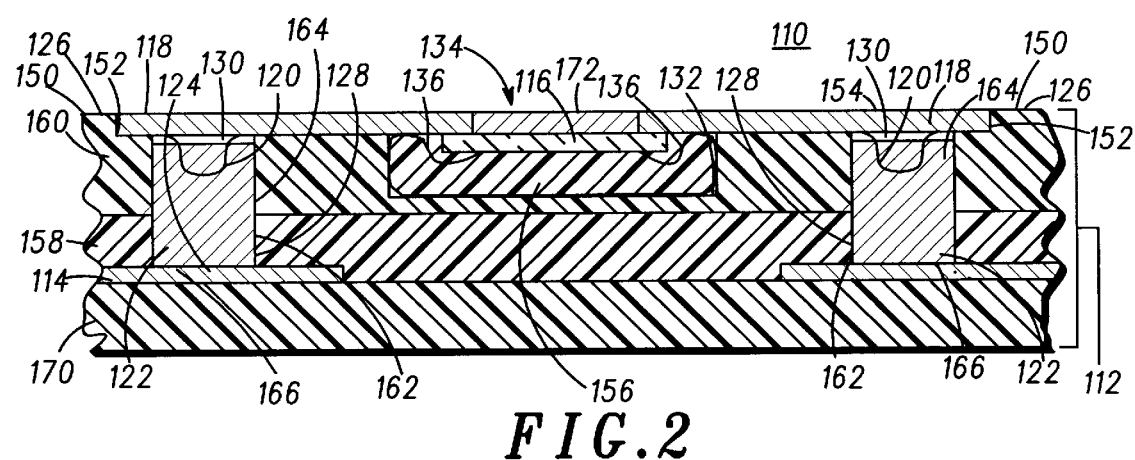
FIG. 2 is a cross-sectional view of a microelectronic assembly formed in accordance with an alternate embodiment of the invention.

The present invention can be better understood with reference to FIGS. 1 and 2. In accordance with a preferred embodiment of this invention, FIG. 1 depicts a cross-sectional view of a microelectronic assembly 10. Assembly 10 comprises a substrate 12 and a component subassembly 34. Substrate 12 preferably comprises a first polymeric layer 58 laminated to a second polymeric layer 60. Substrate 12 is generally formed of multiple layers of a polymeric material laminated together to form an integral layer of a desired thickness. In a preferred embodiment, substrate 12 is formed of three layers 58, 60, and 70, and further includes two protective outer layers. Alternately, a protective coating may be applied to layers 60 and 70.

First polymeric layer 58 is formed on bottom polymeric layer 70 and defines a first via 62, preferably formed by a punching process. In a preferred embodiment, an electrical element 14 is formed on first layer 58. Element 14 is preferably an antenna formed by winding an insulated copper coil on the surface of layer 58. Element 14 is preferably formed of an insulated wire comprising a metal core surrounded by an insulating coating. Alternately, element 14 may be a conductive trace, a jumper trace, a capacitor, a resistor, or any electrical element able to send or receive electrical signals. Electrical element 14 includes a terminal 24 overlying first via 62.

A second polymeric layer 60 is formed on electrical element 14 and first polymeric layer 58. Layer 60 is preferably formed of the same material as layers 58 and 70. Suitable polymers for layers 58, 60, and 70 include polyvinyl chloride (PVC), acrylonitrile-butadiene-styrene (ABS), polycarbonate (PC), polypropylene sulfate (PPS), or polyester (PET). A second via 64 is formed in layer 60 such that second via 64 aligns with first via 62 to form via 28. Second via 64 is formed by a controlled-depth milling process and is accomplished such that material of layer 60 is removed, but terminal 24 is not adversely affected. Alternately, an intermediate polymeric layer may be formed on first layer 58 that includes a punched via that aligns with first via 62. Second layer 60 is then formed on the intermediate layer, and is milled to the punched via in the intermediate layer. In this manner, the depth of the milling does not need to be as precisely controlled, and terminal 24 is not contacted by the milling machinery.

Substrate 12 thereby defines via 28 formed of first via 62 in communication with second via 64. Substrate 12 includes a face 26 opposite first polymeric layer 58. Via 28 includes a via opening 30 at face 26. In a preferred embodiment, insulating coating 68 is removed within via 28 to expose terminal 24 to allow electrical interconnection between integrated circuit component 16 and electrical element 14. In this manner, the copper wire is exposed in via 28 but is insulated outside of via 28.

Component cavity 32 is formed in substrate 12 apart from via 28. Component cavity 32 is sized and shaped to receive integrated circuit component 16 and polymeric body 56. Recess 52 is formed in face 26 to receive metallic lead 18. In a preferred embodiment, substrate 12 includes a perimeter 50 that is substantially planar about recess 52. Lead outer surface 54 forms a generally planar surface with perimeter 50 upon attachment.

Integrated circuit component 16 is attached to lead frame 72 with an epoxy or other adhesive. Integrated circuit component 16 is suitably an integrated circuit die. A component wire lead 36 is formed between component 16 and metallic lead 18 to electrically connect component 16 to lead 18. Wire lead 36 is preferably formed by a wire bonding process.

Component 16 and wire leads 36 are then encapsulated within polymeric body 56. Polymeric body 56 is preferably a polymeric transfer mold, but can alternately be a liquid thermoset encapsulant that is subsequently cured to form polymeric body 56.

Protuberance 20 is formed on and extends from generally planar metallic lead 18. Protuberance 20 is preferably formed by a wire bonding process to form a loop on metallic lead 18. Protuberance 20 can alternately be formed by bonding a metallic bump to metallic lead 18 or by deforming lead 18 to form protuberance 20. In this manner, subassembly 34 is formed and comprises integrated circuit component 16 attached to metallic leads 18 and includes wire leads 36 that electrically connect component 16 to metallic lead 18 and a polymeric body 56 about component 16 and wire leads 36 and protuberance 20 formed on and extending from metallic lead 18.

A bonding agent is dispensed into via 28. Bonding agent is a conductive material, such as a solder paste or a conductive resin. The bonding agent is dispensed into via 28 through via opening 30 to surround terminal 24. The bonding agent may be disposed by screen printing, syringe dispensing, jetting, or the like.

Component subassembly 34 is then superposed onto substrate 12 to form a preassembly. A nonconductive adhesive is applied to secure component subassembly 34 to substrate 12. Protuberance 20 extends into via 28 and contacts the bonding agent in via 28. In a preferred embodiment, the bonding agent completely encircles the loop formed in protuberance 20.

The preassembly is then heated to coalesce the bonding agent to form a conductive body 22 that both electrically and physically attaches terminal 24 to protuberance 20. Conductive body 22 is then solidified by cooling to connect terminal 24 to protuberance 20. In this manner, electrical signals may be transmitted between electrical element 14 and integrated circuit component 16 for processing. The heating step can also concurrently laminate layers 58 and 60 to form an integral polymeric layer.

In an alternate embodiment, as depicted in FIG. 2, a substrate 112 is formed that is similar to substrate 12 formed in the preferred embodiment. Electrical element 114 is formed on bottom polymeric layer 170. This may be done by plating, etching, conductive ink printing, foil lamination, or lead frame forming. First polymeric layer 158 and second polymeric layer 160 are then formed on first layer 158 and a second via 164 is formed therein, similar to the process of the preferred embodiment.

Component subassembly 134 is formed in a manner similar to that of subassembly 134 in the preferred embodiment. Subassembly 134 is superposed onto substrate 112 such that protuberances 120 extend into vias 128 through openings 130 and contact the bonding agent dispensed in vias 128. The preassembly is then heated to bond protuberance 120 to terminal 124 to form an integral microelectronic assembly 110.

Thus, the present invention provides a microelectronic assembly is formed by mounting a component subassembly onto a laminated substrate. The substrate includes an electrical element, such as an antenna, that includes a terminal exposed in the via. The via is filled with a bonding agent, and the integrated circuit component is superposed onto the substrate. Protuberances, formed by looping a wire bond or the like, extend into the via and contact the bonding agent. The bonding agent is then bonded to the protuberance and the terminal to form a conductive body that physically and electrically connects the terminal and the protuberance.

The present invention thereby provides a microelectronic assembly, such as a smart card assembly, that is reliable and easy to manufacture. The preferred method of forming the protuberances, by forming a wire bonding a loop on the metallic lead, is accomplished by using the same machinery that forms the wire bonds between the component and the metallic leads, thereby making the process inexpensive and efficient. Further, an assembly is formed that includes the functionality of both a contact card and a contactless card into an integral assembly while using a single integrated circuit component.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:

a substrate having a face and defining a via having a via opening at the face and further defining a component cavity at the face spaced apart from the via;

an electrical element disposed within the substrate and comprising a terminal at the via;

an integrated circuit component received in the component cavity;

a metallic lead affixed to the face and overlying the via opening, said metallic lead being electrically connected to the integrated circuit component;

a protuberance connected to the metallic lead and extending into the via; and a conductive body within the via electrically connecting the protuberance and the terminal.

2. A microelectronic assembly in accordance with claim 1, wherein the protuberance comprises a metallic wire bonded to the metallic lead.

3. A microelectronic assembly in accordance with claim 1, wherein the protuberance comprises a metallic bump bonded to the metallic lead.

4. A microelectronic assembly in accordance with claim 1, wherein the metallic lead is a plate, and wherein the protuberance is a deformation of the plate.

5. A microelectronic assembly in accordance with claim 1, wherein the conductive body is composed of a solder alloy metallurgically bonded to the protuberance and the terminal.

6. A microelectronic assembly in accordance with claim 1, wherein the conductive body is composed of metallic particles dispersed in a polymeric matrix.

7. A microelectronic assembly in accordance with claim 1, wherein the integrated circuit component comprises a wire lead having an end bonded to the metallic lead.

8. A microelectronic assembly comprising:
a substrate formed of polymeric laminate and having a contact-bearing face, said substrate defining a via having a via opening at the contact-bearing face and further defining a component cavity at the contact-bearing face spaced apart from the via, said substrate further comprising an antenna disposed within the substrate and comprising a terminal at the via;
an integrated circuit component received in the component cavity and comprising a metallic lead affixed to the contact-bearing face and overlying the component cavity and the via opening, said metallic lead being electrically connected to the integrated circuit component, said integrated circuit component comprising a wire loop bonded to the metallic lead and extending into the via; and
a conductive body within the via electrically connecting the wire loop and the terminal.

9. A microelectronic assembly in accordance with claim 8, wherein the wire loop comprises a first end and a second end, the first and second ends welded to the metallic lead, the wire loop further comprising a loop between the first end and the second end extending apart from the metallic lead in a direction generally toward the terminal within the via, and wherein the conductive body extends through the loop to encircle at least a portion of the wire loop therein.

10. A microelectronic assembly in accordance with claim 8, wherein the conductive body is composed of a solder alloy metallurgically bonded to the protuberance and the terminal.

11. A microelectronic assembly in accordance with claim 8, wherein the conductive body is composed of metallic particles dispersed in a polymeric matrix.

12. A microelectronic assembly in accordance with claim 8, wherein the contact-bearing face comprises a generally planar perimeter and a recess, and wherein the metallic lead is formed of a metallic plate having a generally planar outer surface is received in the recess such that the generally planar outer surface is coextensive with the generally planar perimeter.

13. A microelectronic assembly in accordance with claim 8, wherein the integrated circuit component comprises an integrated circuit die attached to the metallic lead.

14. A microelectronic assembly comprising:
a substrate formed of polymeric laminate and having a contact-bearing face, said substrate defining a via having a via opening at the contact-bearing face and further defining a component cavity at the contact-bearing face spaced apart from the via and defining a recess;
an antenna disposed within the substrate and comprising a terminal at the via;
an integrated circuit component received in the component cavity;
a metallic lead affixed to the contact-bearing face and overlying the component cavity and the via opening, said metallic lead being electrically connected to the integrated circuit component and formed of a metallic plate that is received in the recess;
a wire loop bonded to the metallic lead and extending into the via; and
a conductive body within the via electrically connecting the wire loop and the terminal.

15. A microelectronic assembly in accordance with claim 14, wherein the integrated circuit component further comprises a first face including a bond pad, a second face affixed to the lead, and a wire lead attached to the bond pad and the metallic lead.

16. A microelectronic assembly in accordance with claim 15, wherein the integrated circuit component is formed by molding a polymeric body about an integrated circuit die and the wire lead.

17. A microelectronic assembly in accordance with claim 14, wherein the metallic lead partially overlies the component cavity.

18. A microelectronic assembly in accordance with claim 14, wherein the antenna is formed of a metallic wire.

19. A microelectronic assembly in accordance with claim 14, wherein the substrate comprises at least two polymeric layers, and wherein the antenna is interposed between the polymeric layers and bridges the via.

20. A microelectronic assembly in accordance with claim 14, wherein the via has a via bottom remote from the opening, the terminal bridges the via, and the conductive body encircles the terminal.

* * * * *